(12) United States Patent
Ji

(10) Patent No.: US 11,887,658 B2
(45) Date of Patent: Jan. 30, 2024

(54) DATA WRITING METHOD

(71) Applicant: CHANGXIN MEMORY TECHNOLOGIES, INC., Hefei (CN)

(72) Inventor: Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 207 days.

(21) Appl. No.: 17/408,603

(22) Filed: Aug. 23, 2021

(65) Prior Publication Data

US 2021/0398587 A1 Dec. 23, 2021

Related U.S. Application Data

(63) Continuation of application No. PCT/CN2021/100476, filed on Jun. 17, 2021.

(30) Foreign Application Priority Data

Oct. 13, 2020 (CN) .......................... 202011090399.9

(51) Int. Cl.
*G11C 7/10* (2006.01)
*G11C 11/4094* (2006.01)
(Continued)

(52) U.S. Cl.
CPC ............ *G11C 11/4094* (2013.01); *G11C 5/06* (2013.01); *G11C 11/4074* (2013.01);
(Continued)

(58) Field of Classification Search
CPC ... G11C 11/4094; G11C 5/06; G11C 11/4074; G11C 11/4085; G11C 11/4091;
(Continued)

(56) References Cited

U.S. PATENT DOCUMENTS 6,023,434 A * 2/2000 Shore ..................... G11C 29/34
365/201
8,854,873 B1 10/2014 Hollmer
(Continued)

FOREIGN PATENT DOCUMENTS

| CN | 1574073 A | 2/2005 |
| CN | 101176159 A | 5/2008 |

(Continued)

OTHER PUBLICATIONS

Supplementary European Search Report in the European application No. 21856971.3, dated Oct. 19, 2022, 8 pgs.
(Continued)

*Primary Examiner* — Mushfique Siddique
(74) *Attorney, Agent, or Firm* — Cooper Legal Group, LLC

(57) ABSTRACT

A data writing method and a memory, in which the data writing method is used for writing data to a memory array of the memory. The data writing method includes that: old data is read from a target column of the memory array; the old data is updated according to data to be written which carries target data bits information to generate new data; and the new data is written into the target column, in which the memory includes a plurality of data columns, the data is required to be written into the target column, and the target column includes a part of the data columns.

13 Claims, 6 Drawing Sheets

(51) Int. Cl.
- *G11C 11/408* (2006.01)
- *G11C 5/06* (2006.01)
- *G11C 11/4074* (2006.01)
- *G11C 11/4091* (2006.01)
- *G11C 11/4093* (2006.01)
- *G11C 11/4096* (2006.01)

(52) U.S. Cl.
CPC ...... *G11C 11/4085* (2013.01); *G11C 11/4091* (2013.01); *G11C 11/4093* (2013.01); *G11C 11/4096* (2013.01); *G11C 7/1087* (2013.01); *G11C 2207/229* (2013.01)

(58) Field of Classification Search
CPC .............. G11C 7/1087; G11C 11/4093; G11C 11/4096; G11C 2207/229; G11C 11/4076
See application file for complete search history.

(56) References Cited

U.S. PATENT DOCUMENTS

| | | | |
|---|---|---|---|
| 9,823,964 | B2 | 11/2017 | Reed et al. |
| 2002/0181307 | A1 | 12/2002 | Fifield |
| 2004/0233696 | A1 | 11/2004 | Kang |
| 2008/0019199 | A1* | 1/2008 | Uchikoba ........ G11C 29/50016 365/201 |
| 2008/0212379 | A1* | 9/2008 | Asauchi ................ G11C 16/10 365/189.07 |
| 2009/0021995 | A1 | 1/2009 | Oh |
| 2011/0051534 | A1 | 3/2011 | Ishizaki |
| 2012/0089793 | A1 | 4/2012 | Nazar |
| 2016/0062673 | A1 | 3/2016 | Tiwari |
| 2017/0358333 | A1 | 12/2017 | Tiwari |
| 2019/0325929 | A1 | 10/2019 | Kim et al. |
| 2020/0219580 | A1* | 7/2020 | Khan ..................... G11C 29/44 |
| 2021/0043238 | A1 | 2/2021 | Kim et al. |
| 2022/0317890 | A1* | 10/2022 | Ning ................... G06F 11/2094 |

FOREIGN PATENT DOCUMENTS

| | | |
|---|---|---|
| CN | 101533668 A | 9/2009 |
| CN | 102005241 A | 4/2011 |
| CN | 103155041 A | 6/2013 |
| CN | 103680610 A | 3/2014 |
| CN | 104854698 A | 8/2015 |
| CN | 207165238 U | 3/2018 |
| CN | 109935257 A | 6/2019 |
| CN | 110390974 A | 10/2019 |
| JP | 2001351391 A | 12/2001 |
| JP | 2006277926 A | 10/2006 |

OTHER PUBLICATIONS

First Office Action of the Chinese application No. 202011090399.9, dated May 27, 2023. 10 pages with English abstract.

* cited by examiner

DATA WRITING METHOD

CROSS-REFERENCE TO RELATED APPLICATION

This is a continuation application of International Patent Application No. PCT/CN2021/100476, filed on Jun. 17, 2021, which claims priority to Chinese Patent Application No. 202011090399.9, filed on Oct. 13, 2020 and entitled "DATA WRITING METHOD". The disclosures of International Patent Application No. PCT/CN2021/100476 and Chinese Patent Application No. 202011090399.9 are hereby incorporated by reference in their entireties.

BACKGROUND

In a semiconductor memory, in order to obtain a faster rate of data transmission, burst (or prefetch) technology is adopted to store multiple bits of data in a memory array or read multiple bits of data from a memory array at one time. For example, in the related art, 128-bit data is usually written or read synchronously.

SUMMARY

Embodiments of the present disclosure relate to a data writing method.

According to embodiments of the present disclosure, a first aspect provides a data writing method for writing data into a memory array of a memory. The data writing method includes that:

old data is read from a target column of the memory array;

the old data is updated according to data to be written which carries target data bit information to generate new data; and the new data is written into the target column, herein, the memory includes multiple data columns, the data is required to be written into the target column, and the target column includes multiple data columns.

According to embodiments of the present disclosure, a second aspect provides a memory, including: a memory array including multiple data columns; and a controller connected with the memory array and configured to control the memory array to execute the above-mentioned data writing method.

Details of one or more embodiments of the present disclosure will be described in the following drawings and descriptions. Other features and advantages of the present disclosure will become apparent from the description, the accompanying drawings and the claims.

BRIEF DESCRIPTION OF THE DRAWINGS

In order to more clearly illustrate the technical solutions of the embodiments of the present disclosure or the existing technology, the accompanying drawings required for describing the embodiments or the existing technology will be briefly introduced. Apparently, the accompanying drawings in the following description show only some embodiments of the present disclosure, and persons of ordinary skill in the art may still derive other drawings from these accompanying drawings without creative efforts.

DESCRIPTION OF COMPONENT LABELS

Data column: 100; memory cell: 110; bit line: 200; reference bit line: 210; word line: 300; sense amplifier: 400; first control signal line: 410; second control signal line: 420; column selection line: 500; first column selection switch: 510; second column selection switch: 520; data line: 600; reference data line: 610; pre-charge module: 700; and pre-charge control line: 710.

DETAILED DESCRIPTION

In practical writing, in most cases, it is only necessary to write data to a part of memory cells instead of writing the data to 128 bits of memory cells. In order to avoid changes in the data stored in the memory cells that do not need to write the data, an additional shielding mask may be provided for each memory cell to prevent the data from being written. However, an existing processing method requires additional circuit structures or operations, which may cause a circuit to become more complicated.

In order to facilitate the understanding of the embodiments of the present disclosure, the embodiments of the present disclosure will be described in a more comprehensive manner with reference to related drawings. Preferred embodiments of the embodiments of the present disclosure are shown in the accompanying drawings. The embodiments of the present disclosure may, however, be embodied in many different forms which are not limited to the embodiments described herein. On the contrary, the purpose of providing these embodiments is to make the disclosure of the embodiments of the present disclosure more thorough and comprehensive.

Unless defined otherwise, all technical and scientific terms used herein have the same meaning as commonly understood by those of skill in the art to which the present disclosure belongs. The terms used in the description of the embodiments of the present disclosure herein are only for the purpose of describing specific embodiments, and are not intended to limit the embodiments of the present disclosure. The term "and/or" as used herein includes any and all combinations of one or more related listed items.

Figure 1:
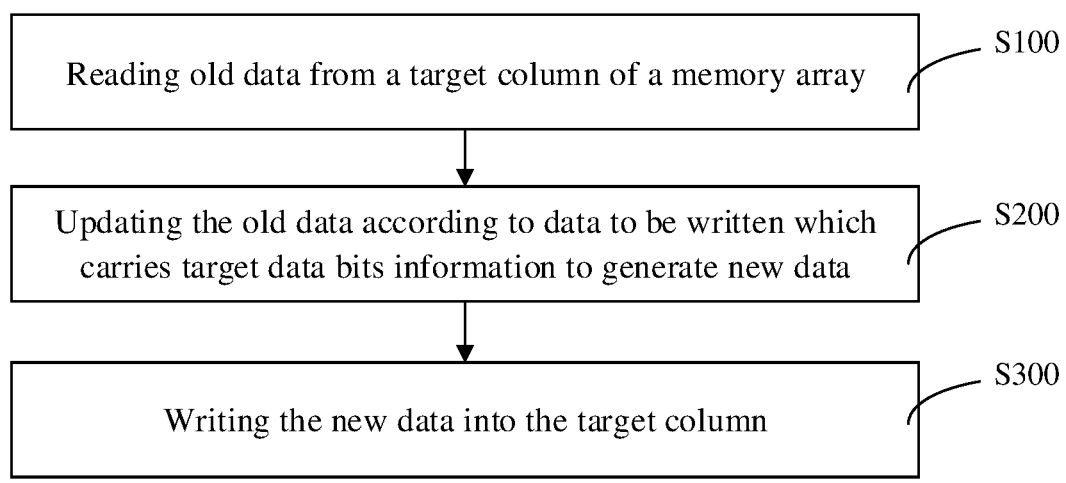
FIG. 1 illustrates a flowchart of a data writing method of a first embodiment.

FIG. 1 illustrates a flowchart of a data writing method of a first embodiment. The data writing method of the embodiment is used to write data into a memory array of a memory. With reference to FIG. 1, in the embodiment, the data writing method includes operation S100 to operation S300.

S100: old data is read from a target column of the memory array.

Figure 2:
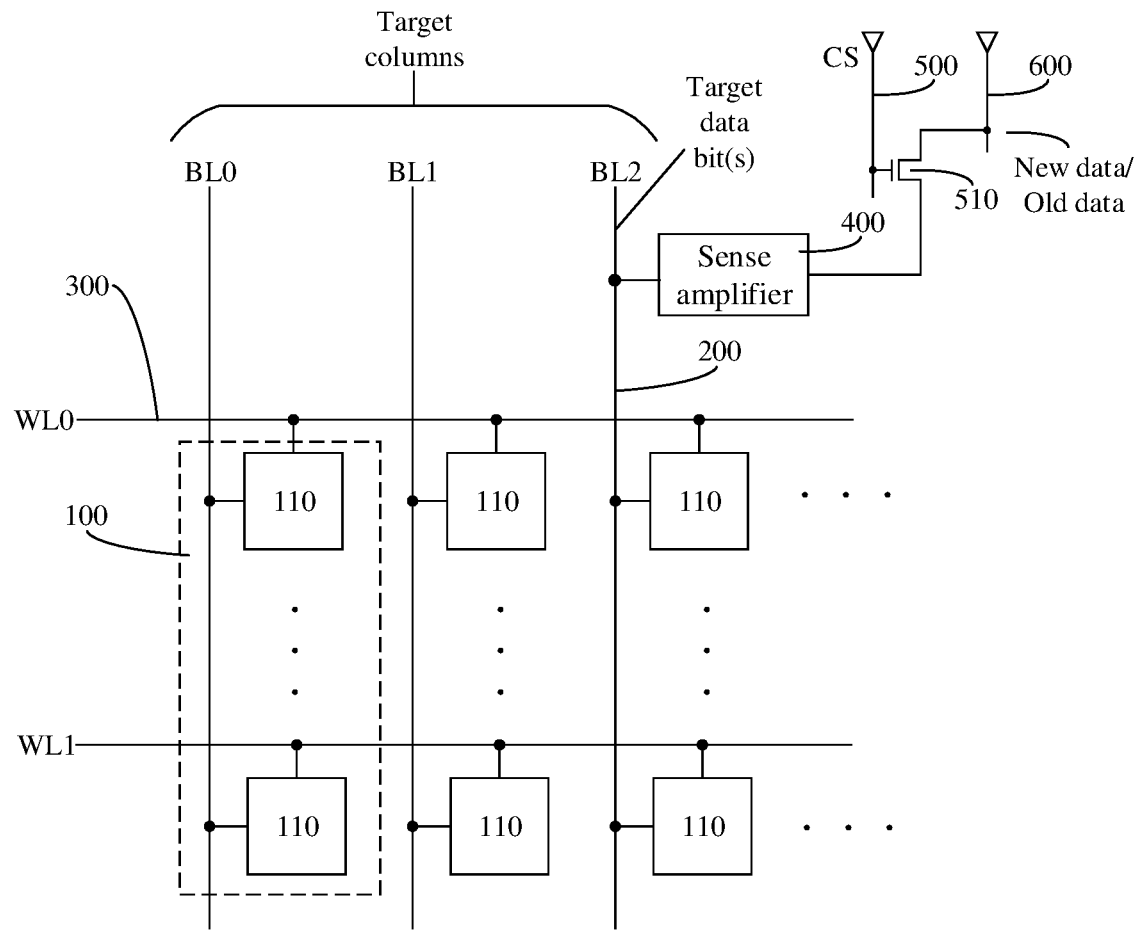
FIG. 2 illustrates a schematic structural diagram of a memory of a first embodiment.

In particular, FIG. 2 illustrates a schematic structural diagram of the memory of the first embodiment. With reference to FIG. 2, the memory array is provided with data columns 100, bit lines 200, word lines 300, sense amplifiers 400, column selection lines 500 and data lines 600 are arranged in the memory array.

Further, each data column 100 includes multiple memory cells 110 located on a same column, and each memory cell 110 is connected to the bit line 200 and the word line 300. When the word lines 300 are turned on, the memory cells 110 may transmit the old data to the bit lines 200, or may obtain data to be written from the bit lines 200 and store the data to be written. When the word lines 300 are turned off, the memory cells 110 maintain existing data thereof unchanged. "Turning on" of the word lines means that the word lines are enabled, for example, which may be used for turning on a connected transistor; and "turning off" of the word lines means that the word lines are disabled, for example, which may be used for turning off the transistor used for connection.

The memory includes the multiple data columns 100, the data is required to be written into the target column, and the target column includes a part of the multiple data columns. Exemplarily, the memory may include n data columns 100, and the target column includes m data columns 100, in which m and n are both positive integers, and m<n. The m data columns 100 in the target column are required to perform data reading and writing operations synchronously. For example, 128 data columns 100 may perform reading and writing operations synchronously. In the embodiment of the present disclosure, 128 data columns 100 performing data reading and writing operations synchronously is taken as an example. Therefore, if it is necessary to write to 8 target data bits in the target column and maintain the remaining 120 bits data unchanged, the 128 bits old data is required to be read from the 128 data columns in the target column at the same time, in which the 8 bits data are modified, and the modified data is stored back into the target column of the memory array in subsequent operations.

With further reference to FIG. 2, the multiple memory cells 110 in the embodiment are arranged in an array, the multiple memory cells 110 located in a same row are connected to a same word line 300, and the multiple memory cells 110 located in a same column are connected to a same bit line 200. That is, the number of the word lines in the memory array is the same as the number of rows of the memory cell 110 of the array, and the number of the bit lines 200 in the memory array is the same as the number of columns of the memory cell 110 of the array.

Furthermore, the memory includes the multiple data lines 600, and the data lines 600 are electrically connected with the data columns 100 in a one-to-one correspondence. It is understandable that the one-to-one electrical connection may be either a direct connection, or an indirect connection realized by the sense amplifiers 400 and various control switches or other structures. The indirect connection manner may achieve more accurate control functions.

In the embodiment, the column selection lines 500 and the data lines 600 are arranged in one-to-one correspondence with the bit lines 200, a first column selection switch 510 is further arranged between the column selection line 500 and the data line 600, a control end of the each first column selection switch 510 is connected with the column selection line 500, a first end of the each first column selection switch 510 is connected with the bit line 200, and a second end of the first column selection switch 510 is connected with the data line 600. Therefore, the first column selection switches 510 are configured to select to conduct or disconnect data transmission paths between the sense amplifiers 400 and the data lines 600 under control of signals transmitted on the column selection lines 500. That is, at least the bit lines 200, the sense amplifiers 400, the first column selection switches 510 and the data lines 600 are arranged between the memory cells 110 and external data pins, and the abovementioned multiple devices and structures jointly compose a data transmission path for storing the data.

It should be noted that in order to simplify the drawings, only one memory cell 110 and a corresponding structure thereof are shown in other embodiments, the corresponding structure include the word lines 300, the bit lines 200, the sense amplifiers 400, the column selection lines 500, the first column selection switches 510 and the data lines 600, and no repetition will be made in other embodiments.

S200: the old data is updated according to the data to be written which carries target data bit information to generate new data.

The target data bits refer to multiple data bits requiring writing new storage data, the multiple data bits may be understood as the multiple memory cells 110, the target data bit information refers to address information corresponding to the target data bits, and the address information may include storage block information, row information and column information. In the embodiment, the update may be realized in a mode of covering a part of the data to be written, so as to generate the new data.

Exemplarily, assuming that "XX01101110XX" is read as the old data from the target column, the above-mentioned old data may be updated to "XX10010001XX" through operation S200, and the updated old data may be used as the new data. It should be noted that in order to simplify the description, the above example only specifically shows the data bits of the old data that need to be updated, that is, the target data bits, and data content stored in non-target data bits is omitted, that is, "X" is used for indicating the omitted non-target data bits. The data of the multiple target data bits and the data of the multiple non-target data bits jointly constitute the new data. For example, data of 8 target data bits and data of 120 non-target data bits jointly constitute 128-bit new data.

S300: the new data is written into the target column.

In particular, all the first column selection switches 510 corresponding to the target column may be turned on synchronously, so that the new data on the multiple data lines corresponding to the target column is transmitted to the corresponding bit lines synchronously. The 128-bit new data is written into the memory cells 110 synchronously in a one-to-one correspondence, and a writing manner is the same as a conventional writing manner for storing data. That is, the data writing method of the embodiment may be realized based on a control circuit of an existing memory array, without additionally arranging a control circuit or specially controlling to turn on a part of the first column selection switches 510. Moreover, based on the writing manner which is the same as the conventional writing manner for storing the data, a control logic of the writing method of the embodiment is relatively simple, and more convenient compatibility with an existing memory is achieved.

Figure 3:
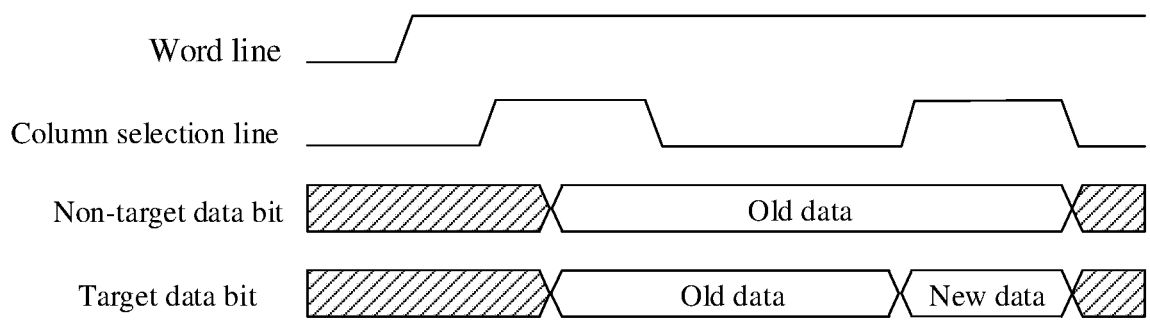
FIG. 3 illustrates a timing diagram corresponding to the data writing method of the embodiment as illustrated in FIG. 1.

FIG. 3 illustrates a timing diagram corresponding to the data writing method of the embodiment as illustrated in FIG. 1. With reference to FIG. 3, in the embodiment, when the data is written, the word lines 300 are always maintained turning on, and reading and writing of a signal may be controlled through the column selection lines 500. In particular, for the non-target data bits, the data stored thereon is maintained unchanged. For the target data bits, the old data is required to be updated, that is, the old data is replaced with the new data. Exemplarily, the first column selection switches 510 may be turned on in response to a high level state of the column selection lines 500 so as to transmit the old data to the data lines 600, and then the old data is updated at the data lines 600; and after the old data is updated as the data to be written and the new data is generated, and in response to the high level state of the column selection lines 500, the first column selection switches 510 are turned on so as to transmit the data to be written back to the corresponding memory cells 110.

In the embodiment, the data writing method is used to write the data into the memory array of the memory. The data writing method includes: the old data is read from the target column of the memory array; the old data is updated according to the data to be written which carries the target data bit information to generate the new data; and the new data is written into the target column, in which the memory includes the multiple data columns 100, the data is required to be written into the target column and the target column includes multiple data columns 100. Based on the above-mentioned multiple operations, the method of the embodiment may be compatible with an existing memory structure for accurate data writing, so that the data writing method without arranging an additional hardware structure is realized.

Figure 4:
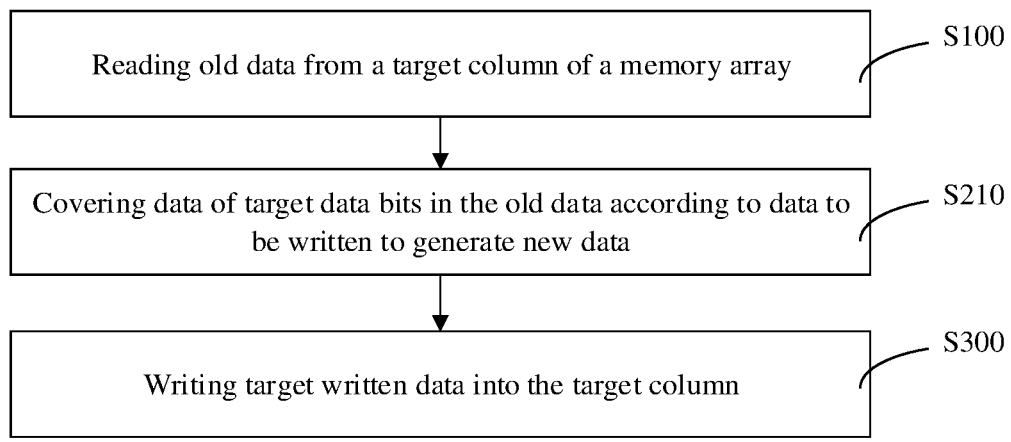
FIG. 4 illustrates a flowchart of a data writing method of a second embodiment.

FIG. 4 illustrates a flowchart of a data writing method of a second embodiment. With reference to FIG. 4, in the embodiment, operation S200 includes: S210: data of target data bits in old data is covered according to data to be written, so as to generate new data. A covering operation may be realized by adjusting a voltage of a new data signal. For example, if old data of the target data bits is 0 (that is, a low level), a voltage signal of a high level may be transmitted to corresponding bit lines 200 to raise a signal on the bit lines 200 to 1, so that data stored in memory cells 110 is modified and covering of the old data is realized.

Figure 5:
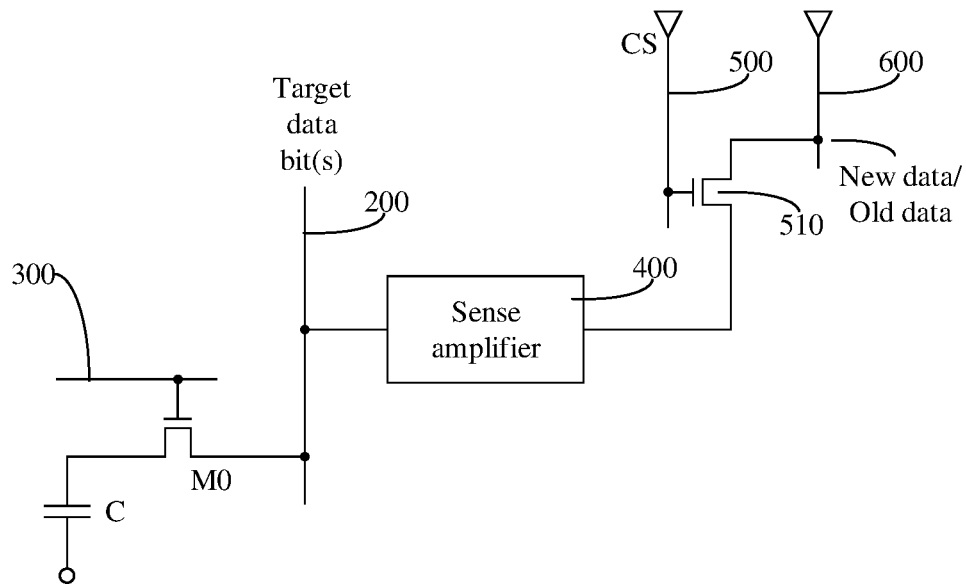
FIG. 5 illustrates a schematic structural diagram of a memory of a second embodiment.

FIG. 5 illustrates a schematic structural diagram of a memory of a second embodiment. With reference to FIG. 5, in the embodiment, a memory cell 110 includes a storage capacitor C and a data switch M0, a first end of the data switch M0 is connected with the storage capacitor C, and a second end of the data switch M0 is connected with the bit line 200. Further, the data switch M0 may be a negative channel metal oxide semiconductor (NMOS) transistor, a gate of the data switch M0 is connected with the word line 300, a drain of the data switch M0 is connected with the bit line 200, and a source of the data switch M0 is grounded through the storage capacitor C or is connected with a half of a power voltage through the storage capacitor C. When a voltage of a capacitor plate connected to the data switch M0 is the power voltage, the stored data is "1", that is, high-level data is stored; and when the voltage of the capacitor plate connected to the data switch M0 is 0, the stored data is "0", that is, low-level data is stored.

Figure 6:
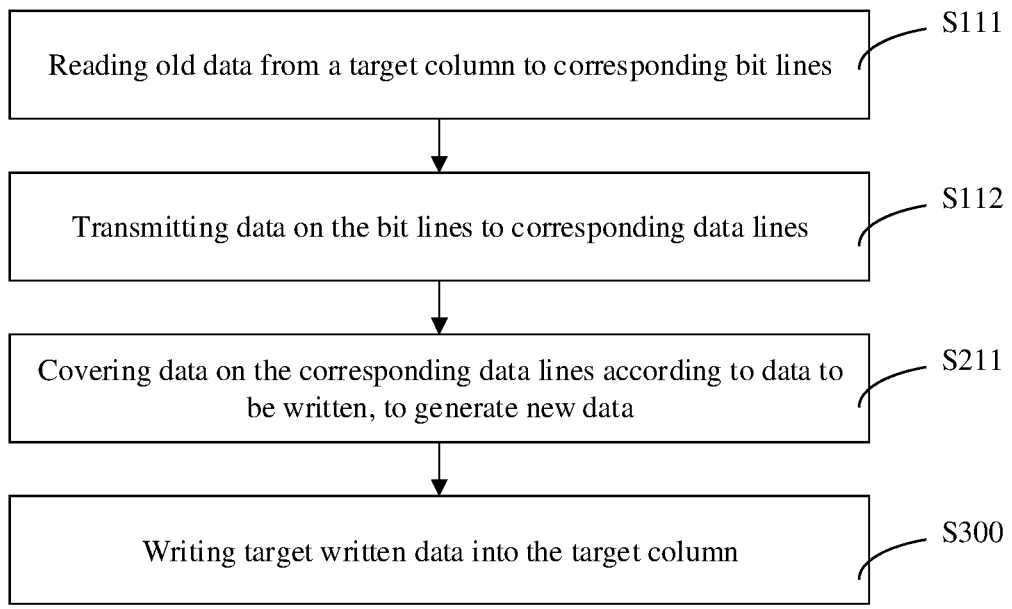
FIG. 6 illustrates a flowchart of a data writing method of a third embodiment.

Further, FIG. 6 illustrates a flowchart of a data writing method of a third embodiment. In the embodiment, the covering operation of the old data in operation S210 in the above embodiment may be performed on data lines 600. Correspondingly, operation S100 includes: S110: the old data is read from a target column to corresponding data lines 600, so as to read the data to the data lines 600.

In particular, with reference to FIG. 6, operation S110 may include operation S111 to operation S112.

S111: the old data is read from the target column to corresponding bit lines 200.

Data of the m data columns included in the target column are read to the corresponding bit lines 200 respectively in a one-to-one correspondence. In particular, first ends and second ends of data switches M0 may be conducted, so as to read data from storage capacitors C of the target column to the bit lines 200. An enabled word line signal may be transmitted to word lines 300 corresponding to the target column so as to conduct the first ends and the second ends of the data switches M0.

S112: data on the bit lines 200 is transmitted to the corresponding data lines 600.

Data on the m bit lines 200 are transmitted to the corresponding data lines 600 respectively in a one-to-one correspondence. In particular, first ends and second ends of first column selection switches 510 may be conducted, so as to read the data from the bit lines 200 to the data lines 600. An enabled signal may be transmitted to a first column selection line 500 corresponding to the first column selection switch 510, so as to conduct a first end and a second end of a first column selection switch Msc1.

Correspondingly, with further reference to FIG. 6, operation S210 includes that: S211: the data on the corresponding data lines 600 is covered according to data to be written, to generate new data. It is understandable that data reading and covering methods in the embodiment are matched with data reading methods of an existing memory, that is, the covering operation may be realized without arranging a special data reading control method or arranging an additional hardware structure.

Figure 7:
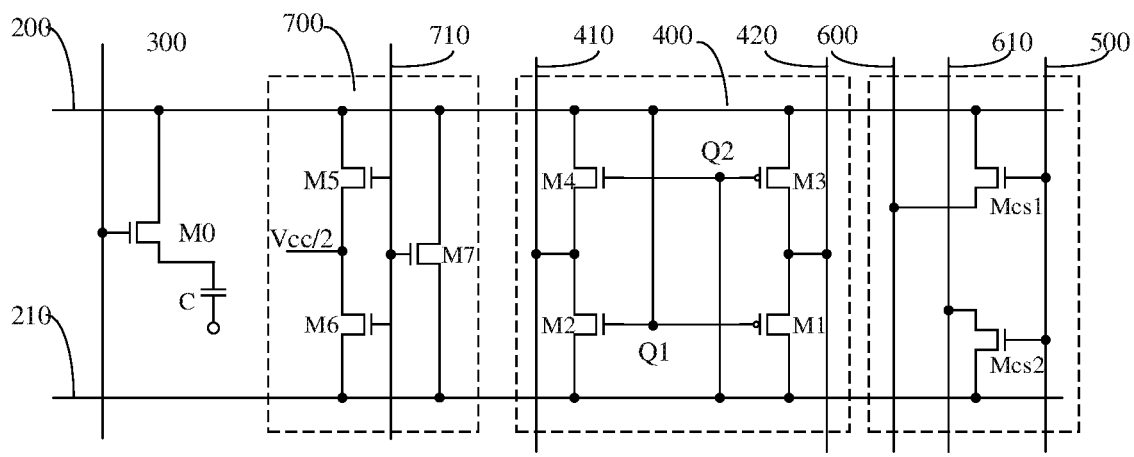
FIG. 7 illustrates a schematic structural diagram of a memory of a third embodiment.

FIG. 7 illustrates a schematic structural diagram of a memory of a third embodiment. With reference to FIG. 7, in the embodiment, the memory further includes multiple reference bit lines 210, each reference bit line 210 is in one-to-one correspondence with each bit line 200. In the embodiment, a signal is transmitted through a common difference between the bit lines 200 and the reference bit lines 210, which may effectively improve the reliability of data transmission, thereby improving the reliability of the memory. Further, each sense amplifier 400 is in one-to-one correspondence with each bit line 200, and is connected between the corresponding bit line 200 and the corresponding reference bit line 210. That is, each sense amplifier 400 is provided with at least two input ends and two output ends, the two input ends are respectively connected to the bit line 200 and the reference bit line 210 in a one-to-one correspondence, and the two output ends are also connected to the bit line 200 and the reference bit line 210 in a one-to-one correspondence, so that voltage differences between the bit lines 200 and the reference bit lines 210 are amplified.

Further, data transmitted on the reference bit lines 210 may be opposite to the data transmitted on the bit lines 200 in phase. An opposite phase means that if the data transmitted on the bit lines 200 is 1, the data transmitted on the reference bit lines 210 is 0; and if the data transmitted on the bit lines 200 is 0, the data transmitted on the reference bit lines 210 is 1. It is understandable that through the amplification of the sense amplifies 400, the signal may be pulled up to a high-level signal or pulled down to a low-level signal. However, before the signal is fully amplified by the sense amplifies 400, a voltage on the bit lines 200 configured to transmit data as 1 is not a high-level signal in the absolute sense, but only slightly higher than a voltage on the reference bit lines 210. Similarly, the voltage on the bit lines 200 configured to transmit data as 0 is not a low-level signal in the absolute sense, but only slightly lower than the voltage on the reference bit lines 210.

Figure 8:
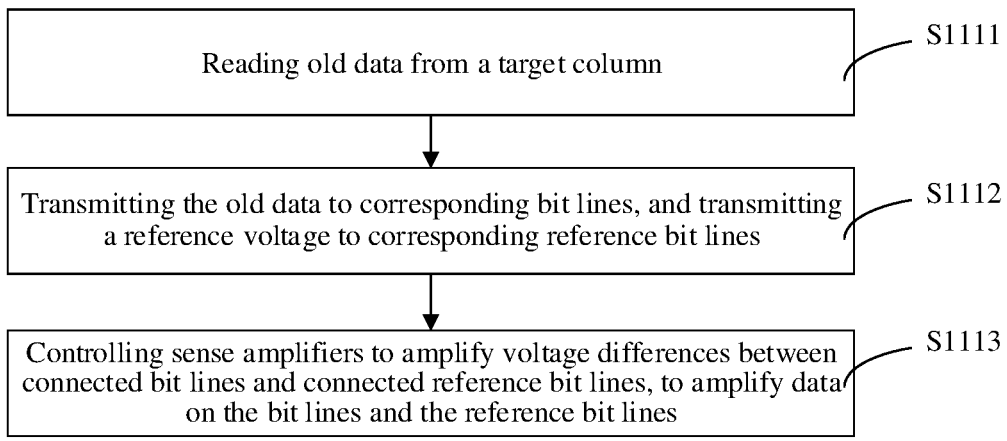
FIG. 8 illustrates a sub-flowchart of step S111 of an embodiment.

Based on the above structure, FIG. 8 illustrates a sub-flowchart of operation S111 of an embodiment. With reference to FIG. 8, in the embodiment, operation S111 includes operation S1111 to operation S1113.

S1111: the old data is read from the target column;

S1112: the old data is transmitted to corresponding bit lines 200, and a reference voltage is transmitted to corresponding bit lines 210; and S1113: sense amplifiers are controlled to amplify the voltage differences between the connected bit lines 200 and reference bit lines 210 to amplify the data on the bit lines 200 and the reference bit lines 210.

In particular, an amplifying process of the sense amplifiers is described in combination with FIG. 7 and FIG. 8. As shown in FIG. 7, each sense amplifier 400 includes multiple transistors, the multiple transistors include two N-type transistors and two P-type transistors, the two N-type transistors are respectively one first N-type transistor M2 and one second N-type transistor M4, and the two P-type transistors are respectively one first P-type transistor M1 and one second P-type transistor M3.

In particular, a source end of the first P-type transistor M1 is connected with a source end of the second P-type transistor M3, and both source ends of them are jointly connected with a second control signal line 420; a source end of the first N-type transistor M2 is connected with a source end of the second N-type transistor M4, and both source ends of them are jointly connected with a first control signal line 410; a drain end of the first P-type transistor M1 is connected with a drain end of the first N-type transistor M2, and both drain ends of them are jointly connected with a second node Q2; and a drain end of the second P-type transistor M3 is connected with a drain end of the second N-type transistor M4, and both drain ends of them are jointly connected with a first node Q1.

Further, with further reference to FIG. 7, the memory further includes a pre-charge module 700, the pre-charge module 700 are respectively connected with the bit line 200 and the reference bit line 210. In the embodiment, the first node Q1 and the second node Q2 of the sense amplifier 400 are respectively connected with the bit line 200 and the reference bit line 210, so that in a pre-charging stage of the sense amplifier 400, the first node Q1 and the second node Q2 are both pre-charged to a preset voltage value, in which the preset voltage value may be a half of the power voltage, that is, Vcc/2. In other specific implementations, the preset voltage value may be set as other values according to circuit requirements, for example, a value higher than Vcc/2 or lower than Vcc/2.

Further, another pre-charge module may be arranged between the second control signal line 420 and the first control signal line 410, so that in the pre-charging stage of the sense amplifier 400, the second control signal line 420 and the first control signal line 410 are both charged to the preset voltage value. The pre-charge module between the two control signal lines may be provided with a same circuit structure as the pre-charge module 700 in FIG. 7.

With further reference to FIG. 7, the pre-charge module 700 includes a first pre-charge transistor M5, a second pre-charge transistor M6, and a third pre-charge transistor M7. Three control ends of the first pre-charge transistor M5, the second pre-charge transistor M6, and the third pre-charge transistor M7 are connected to a pre-charge control line 710. A source end of the first pre-charge transistor M5 and a source end of the second pre-charge transistor M6 are connected, and are commonly connected to the preset voltage Vcc/2. A drain end of the first pre-charge transistor M5 is connected to the bit line 200, a drain end of the second pre-charge transistor is connected to the reference bit line 210, and a source end and a drain end of the third pre-charge transistor M7 are respectively connected to the bit line 200 and the reference bit line 210 in a one-to-one correspondence. Exemplarily, assuming that the preset voltage is Vcc/2, when the pre-charge control line 710 transmits an enabled signal, the three pre-charge transistors are all conducted, and both the bit line 200 and the reference bit line 210 can be charged to Vcc/2. In other specific implementations, those skilled in the art may reasonably set a structure of the pre-charging module 700 and the preset voltage value according to actual needs.

Further, a working mode of the memory is further described in combination with the sense amplifier 400 and the pre-charge module 700. The memory includes multiple working stages, specifically including: a pre-charging stage, a charge sharing stage, and a signal amplification stage.

In the pre-charging stage, the first node Q1 and the second node Q2 are pre-charged by the pre-charge module 700, so that the voltage of the bit line 200 and the voltage of the reference bit line 210 are both pre-charged to the preset voltage value, for example, Vcc/2. At the same time, the second control signal line 420 and the first control signal line 410 are also pre-charged to Vcc/2. In the charge sharing stage, the word line 300 controls the data switch M0 to be turned on, so as to share charge stored in memory cells to the bit line 200. In the signal amplification stage, the sense amplifier 400 is configured to amplify the data on the bit line 200 and the reference bit line 210.

In one of the embodiments, a mismatch elimination stage may be further configured after the pre-charging stage, the memory further includes an offset voltage compensation control module, and the voltage compensation control module may include multiple transistor switches to compensate for adverse influence on data amplification caused by mismatch of transistor performance in the sense amplifiers 400. In the mismatch elimination stage, the pre-charge module 700 does not work, that is, the multiple pre-charge transistors in the pre-charge module 700 are all in an off state.

The mismatch elimination stage includes a first mismatch elimination stage. Exemplarily, in the first mismatch elimination stage, through the offset voltage compensation control module, the first positive channel metal oxide semiconductor (PMOS) transistor M1 and the second PMOS transistor M3 may be configured in a diode connection mode, and the first NMOS transistor M2 and the second NMOS transistor M4 may be configured in an amplification mode, so that a mismatched voltage is amplified by gain to form an over-driving manner, to accelerate the establishment of a voltage difference for compensation and store it on a parasitic capacitor of the bit lines 200 and the reference bit lines 210. As another example, through the offset voltage compensation module, the first PMOS transistor M1 and the second PMOS transistor M3 may be configured in the amplification mode, and the first NMOS transistor M2 and the second NMOS transistor M4 may be configured in the diode connection mode, so that the gain is used to amplify the mismatched voltage to form an over-driving manner, to accelerate the establishment of the voltage difference for compensation and store it on the parasitic capacitor of the bit lines 200 and the reference bit lines 210.

Further, the mismatch elimination stage may also include a second mismatch elimination stage. A second mismatch elimination manner is adopted, including that: the first PMOS transistor M1, the second PMOS transistor M3, the first NMOS transistor M2, and the second NMOS transistor M4 are all configured in the diode connection mode to adjust the compensation voltage.

In the above-mentioned specific mismatch elimination process, the first mismatch elimination manner has the advantage of fast speed, but the disadvantage is that time is not easy to control, and over compensation will occur as time goes by. The advantage of the second mismatch elimination manner is that as time goes by, it has the ultimate stability and meets the expected ideal compensation, but the disadvantage is that it takes a long time.

Therefore, in another embodiment, the first mismatch elimination as time goes by and the second mismatch elimination as time goes by may be combined, and the mismatch elimination stage is divided into the first mismatch elimination stage and the second mismatch elimination stage. In order to avoid over-compensation, the second mismatch elimination stage may be carried out after the first mismatch elimination stage. The combination of the first mismatch elimination stage and the second mismatch elimination stage may achieve a faster compensation speed without the problem of over-compensation, and in terms of time control, dependence on process, voltage and temperature of the transistor is relatively low.

Figure 9:
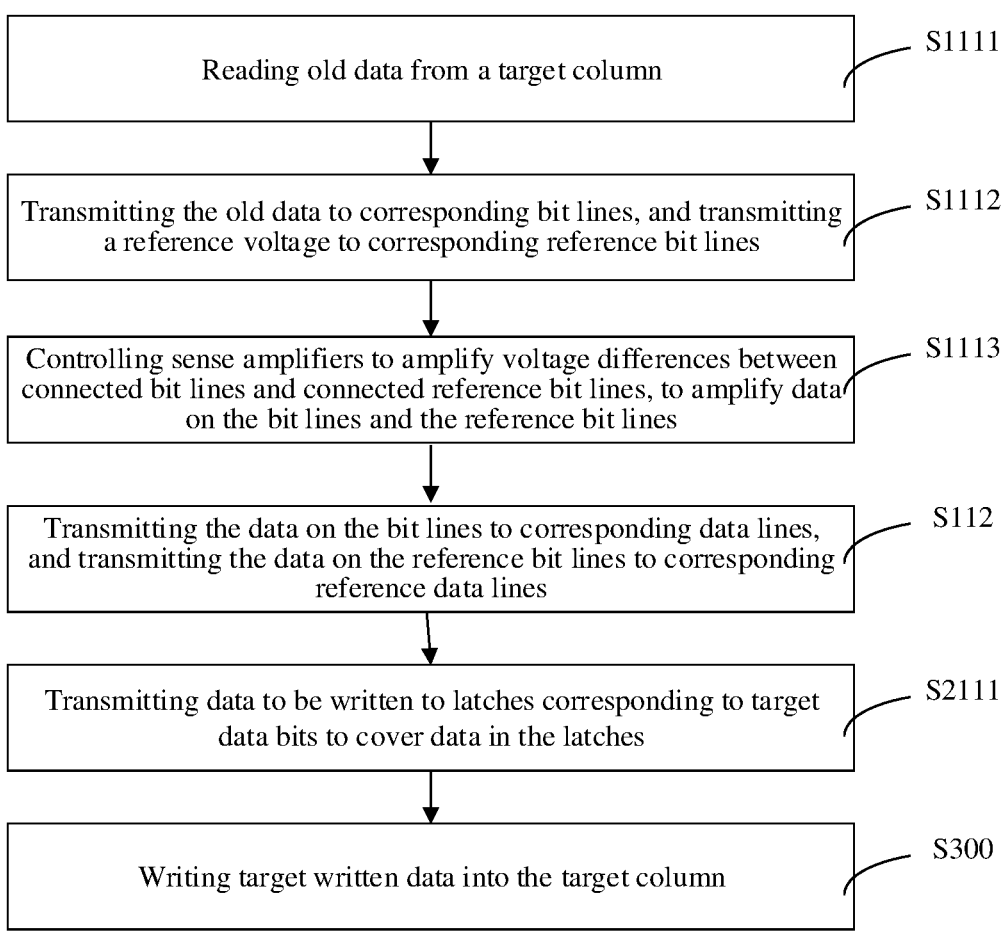
FIG. 9 illustrates a flowchart of a data writing method of a fourth embodiment.

With further reference to FIG. 7, in one of the embodiments, the memory further includes multiple reference data lines 610, each reference data line 610 and each data line 600 are arranged in a one-to-one correspondence, at least one latch is connected between the data line 600 and the reference data line 600, and each latch is configured to latch one data bit of data. FIG. 9 illustrates a flowchart of a data writing method of a fourth embodiment. With reference to FIG. 9, in the embodiment, operation S211 includes operation S2111: data to be written is transmitted to the latch corresponding to target data bit to cover data in the latch. In particular, the data to be written may be transmitted to data lines 600, and inverted data of the data to be written may be transmitted to reference data lines 610, so as to cover the data in the latches. Further, after the data in the latches is covered and first column selection switches Mcs1 and Mcs2 are maintained turning on, data on bit lines 200 and reference bit lines 210 will be changed accordingly, thereby realizing writing of new data.

With further reference to FIG. 7, in correspondence with the reference data lines 600, the memory further includes multiple second column selection switches Msc2, a first end of each second column selection switch Msc2 is connected to the reference bit line 210, a second end of each second column selection switch Msc2 is connected to the reference data line 610, a control end of each second column selection switch Msc2 is connected to column selection line 500. The second column selection switches Msc2 are configured to control data transmission paths between the reference bit lines 210 and the reference data lines 610 to be turned on or turned off. Therefore, operation S112 further includes: the data on the reference bit line 210 is transmitted to the corresponding reference data line 610. That is, all the second column selection switches Msc2 corresponding to the target column are turned on, so that the data on the multiple reference bit lines 210 corresponding to the target column are synchronously transmitted to the corresponding reference data lines 610.

In one of the embodiments, before operation S2111, the following may be further included: data transmission path between the bit line 200 and the corresponding data line 600 is disconnected. Accordingly, before operation S300, the following may be further included: the data transmission path between the bit line 200 and the corresponding data line 600 is conducted. It is understandable that an arrangement method of the embodiment may ensure that when performing data covering operations on the latches on the data lines 600, voltages on the bit lines 200 will not affect voltages on the data lines 600, so that the accuracy of the data in the latches is ensured.

In one of the embodiments, operation S112 includes that: all the first column selection switches Msc1 corresponding to the target column are turned on, so that new data on the multiple bit lines 200 corresponding to the target column are synchronously transmitted to the corresponding data lines 600. Correspondingly, before operation S300, the following is further included: all the first column selection switches Msc1 corresponding to the target column are turned on, so that the new data on the multiple data lines 600 corresponding to the target column is synchronously transmitted to the corresponding bit lines 200.

It is understandable that when the data to be written is written into the latches, there is a certain amount of power consumption. If the data transmission paths between all the target columns and the corresponding data lines 600 are turned on, during the data writing process, charge stored in the target columns will cause a certain impact on writing, which will increase the power consumption of writing. Therefore, in the embodiment, by turning off the data transmission paths between the target columns and the corresponding data lines 600 before writing to the latches, and turning on the data transmission paths between the target columns and the corresponding data lines 600 after writing, invalid power consumption during writing may be greatly reduced, thereby improving the efficiency of the data writing method and reducing the total power consumption of the memory.

Figure 10:
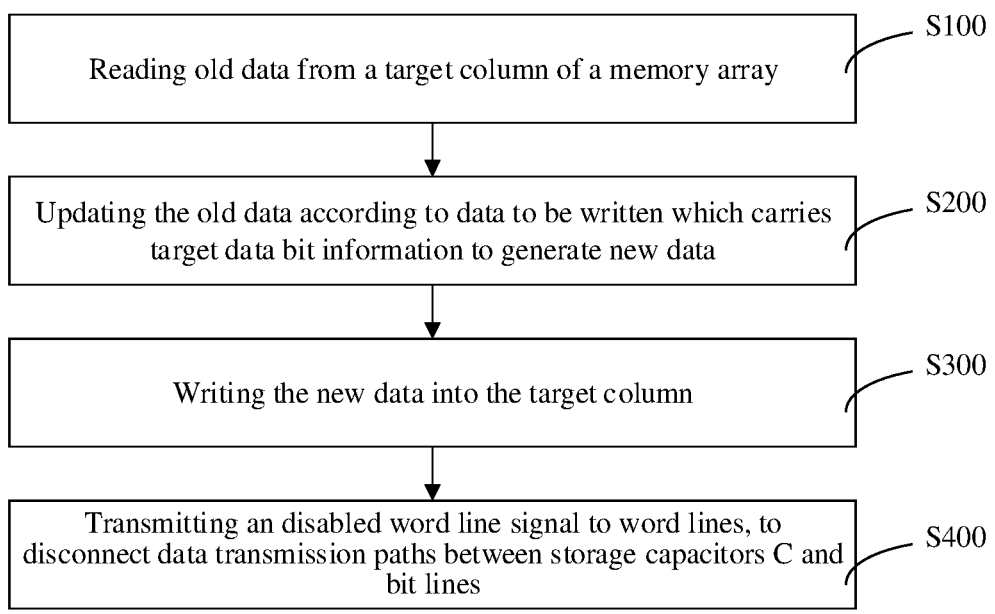
FIG. 10 illustrates a flowchart of a data writing method of a fifth embodiment.

FIG. 10 illustrates a flowchart of a data writing method of a fifth embodiment. With reference to FIG. 10, in the embodiment, the data writing method further includes that: S400: an disabled word line signal is transmitted to word lines 300 to disconnect data transmission paths between storage capacitors C and bit lines 200.

It should be understood that although the operations of the flowcharts are shown sequentially as indicated by arrows, the operations are not necessarily performed sequentially as indicated by the arrows. Unless specifically stated otherwise herein, the operations are not performed in a strict order of limitation, and the operations may be performed in other orders. Moreover, at least a part of the operations in the flowcharts may include multiple sub operations or multiple stages that are not necessarily performed at the same time, but may be performed at different times, and the operations or stages are not necessarily performed in sequence, but rather may be performed in turns or alternation with other operations or at least a part of the operations or stages in the other operations.

An embodiment of the present disclosure further provides a memory, including: a memory array including multiple data columns 100; and a controller connected to the memory array, and configured to control the memory array to perform the abovementioned data writing method. Based on the abovementioned data writing method, the embodiment provides the memory with a simple hardware structure and accurate writing results.

Various technical features in the foregoing embodiments may be randomly combined. For ease of simple description, not all possible combinations of the various technical features in the foregoing embodiments are described. However, as long as no contradiction exists among the combinations of these technical features, they should be regarded as falling within the scope of the present specification.

The foregoing embodiments only describe several implementations of the present disclosure, and their description is specific with details, but cannot therefore be understood as a limitation to the patent scope of the present disclosure. It should be noted that those of ordinary skill in the art may further make variations and improvements without departing from the inventive concept of the embodiments of the present disclosure, and these variations and improvements all fall within the protection scope of the embodiments of the present disclosure. Therefore, the protection scope of the embodiments of the present disclosure should be subject to the appended claims.

The invention claimed is:

1. A data writing method, used for writing data into a memory array of a memory, comprising:
reading old data from a target column of the memory array;
updating the old data according to data to be written which carries target data bit information to generate new data; and
writing the new data into the target column,
wherein the memory comprises a plurality of data columns, the data to be written is required to be written into the target column, and the target column includes a part of the plurality of data columns,
wherein updating the old data according to the data to be written which carries the target data bit information to generate the new data comprises:
covering data of target data bits in the old data according to the data to be written, to generate the new data.

2. The data writing method of claim 1, wherein the memory further comprises a plurality of data lines, each data line is electrically connected with each data column in a one-to-one correspondence, and reading the old data from the target column of the memory array comprises:
reading the old data from the target column to corresponding data lines; and
wherein covering the data of the target data bits in the old data according to the data to be written comprises:
covering data on the corresponding data lines according to the data to be written, to generate the new data.

3. The data writing method of claim 2, wherein the memory comprises a plurality of bit lines, each bit line is connected with each data column in a one-to-one correspondence, and reading the old data from the target column to the corresponding data lines comprises:
reading the old data from the target column to corresponding bit lines; and
transmitting data on the corresponding bit lines to the corresponding data lines.

4. The data writing method of claim 3, wherein the memory further comprises a plurality of reference bit lines and a plurality of sense amplifiers, each reference bit line is in one-to-one correspondence with each bit line, each sense amplifier is in one-to-one correspondence with each bit line and is connected between a corresponding bit line and a corresponding reference bit line, and reading the old data from the target column to the corresponding bit lines comprises:
reading the old data from the target column;
transmitting the old data to the corresponding bit lines, and transmitting a reference voltage to the corresponding reference bit lines; and
controlling sense amplifiers to amplify voltage differences between connected bit lines and connected reference bit lines, to amplify data on the bit lines and the reference bit lines.

5. The data writing method of claim 4, wherein the memory further comprises a plurality of reference data lines, each reference data line is in one-to-one correspondence with each data line, the data line and the reference data line are connected by at least one latch, each latch is configured to latch data of one data bit, and covering the data on the corresponding data lines according to the data to be written comprises:
transmitting the data to be written to latches corresponding to the target data bits, to cover data in the latches.

6. The data writing method of claim 5, wherein before transmitting the data to be written to the latches corresponding to the target data bits, the method further comprises:
disconnecting data transmission paths between the bit lines and the data lines corresponding to the bit lines; and
before writing the new data to the target column, the method further comprises: conducting the data transmission paths between the bit lines and the data lines corresponding to the bit lines.

7. The data writing method of claim 4, wherein transmitting the reference voltage to the corresponding reference bit lines comprises:
pre-charging the reference bit lines to a half of a power voltage.

8. The data writing method of claim 4, wherein each data column comprises a plurality of memory cells, each memory cell comprises a storage capacitor and a data switch, the data switch is configured to control a data transmission path between the storage capacitor and the bit line to be turned on or turned off, and transmitting the old data to the corresponding bit lines comprises:
conducting data switches to read data from storage capacitors corresponding to the target column to the corresponding bit lines.

9. The data writing method of claim 8, wherein the memory further comprises a plurality of word lines, each word line is connected with a control end of each data switch, and conducting the data switches comprises:
transmitting enabled word line signal to word lines to conduct first ends and second ends of the data switches; and
the data writing method further comprises: transmitting disabled word line signal to the word lines to disconnect data transmission paths between the storage capacitors and the bit lines.

10. The data writing method of claim 4, wherein the memory further comprises a plurality of first column selection switches, each first column selection switch is configured to control a data transmission path between the bit line and the data line corresponding to the bit line to be turned on or turned off, and transmitting the data on the corresponding bit lines to the corresponding data lines comprises:
turning on all the first column selection switches corresponding to the target column, to transmit the new data on the plurality of bit lines corresponding to the target column to the corresponding data lines synchronously.

11. The data writing method of claim 10, wherein writing the new data into the target column comprises:
turning on all the first column selection switches corresponding to the target column, to transmit the new data on the plurality of data lines corresponding to the target column to the corresponding bit lines synchronously.

12. The data writing method of claim 10, wherein the memory further comprises a plurality of second column selection switches, each second column selection switch is configured to control a data transmission path between the reference bit line and a reference data line to be turned on or turned off, and reading the old data from the target column to the corresponding data lines comprises:

turning on all the second column selection switches corresponding to the target column, to transmit data on the plurality of reference bit lines corresponding to the target column to corresponding reference data lines synchronously.

13. A memory, comprising:

a memory array, comprising a plurality of data columns; and a controller, connected with the memory array and configured to control the memory array to perform a data writing method, wherein the data writing method comprises:

reading old data from a target column of the memory array;

updating the old data according to data to be written which carries target data bit information to generate new data; and writing the new data into the target column, wherein the data to be written is required to be written into the target column, and the target column includes a part of the plurality of data columns, wherein updating the old data according to the data to be written which carries the target data bit information to generate the new data comprises:

covering data of target data bits in the old data according to the data to be written, to generate the new data.

* * * * *